United States Patent [19]

Lamb et al.

[11] Patent Number: 5,011,782

[45] Date of Patent: Apr. 30, 1991

[54] METHOD OF MAKING PASSIVATED ANTIREFLECTIVE COATING FOR PHOTOVOLTAIC CELL

[75] Inventors: Walter R. Lamb, Sunnyvale; Darrell Griffin, Stratford, both of Calif.

[73] Assignee: Electric Power Research Institute, Palo Alto, Calif.

[21] Appl. No.: 332,287

[22] Filed: Mar. 31, 1989

[51] Int. Cl.⁵ .............................. H01L 31/18
[52] U.S. Cl. ........................ 437/2; 437/225; 437/974; 437/227; 357/30; 136/255; 136/256
[58] Field of Search .......... 437/2, 225, 3, 974, 437/227; 357/30 J; 448/DIG. 17, DIG. 135; 136/225, 256

[56] References Cited

U.S. PATENT DOCUMENTS

| | | | |
|---|---|---|---|
| 4,070,689 | 1/1978 | Coleman et al. | 437/2 |
| 4,416,052 | 11/1983 | Stern | 437/5 |
| 4,579,609 | 4/1986 | Reif et al. | 148/DIG. 17 |
| 4,705,760 | 11/1987 | Kaganowicz et al. | 148/DIG. 17 |
| 4,751,191 | 6/1988 | Gonsiorawski et al. | 437/2 |
| 4,824,489 | 4/1989 | Cogan et al. | 136/259 |
| 4,927,770 | 5/1990 | Swanson | 437/2 |
| 4,946,716 | 8/1990 | Corrie | 437/227 |

OTHER PUBLICATIONS

"Design of Antireflection Coatings for Textured Silicon Solar Cells"; B. L. Sopori et al.; Solar Cells, 8 (1983), pp. 249–261.

Primary Examiner—Brian E. Hearn
Assistant Examiner—Trung Dang
Attorney, Agent, or Firm—Henry K. Woodward

[57] ABSTRACT

The performance of a silicon photovoltaic cell is improved while process yield is maintained by first forming doped regions in a major surface of a silicon wafer and providing electrical interconnections to the doped regions prior to thinning the wafer by etching another major surface of the wafer. A passivating antireflection layer is applied to the etched surface after the surface is precleaned. The precleaning can be by ammonia plasma applied in situ as a precursor to depositing silicon nitride as the passivation layer.

9 Claims, 2 Drawing Sheets

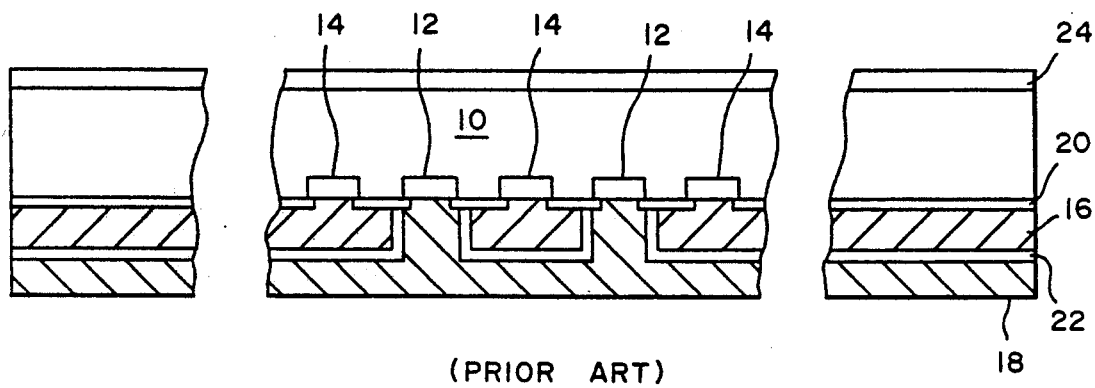
(PRIOR ART)
FIG.—1A
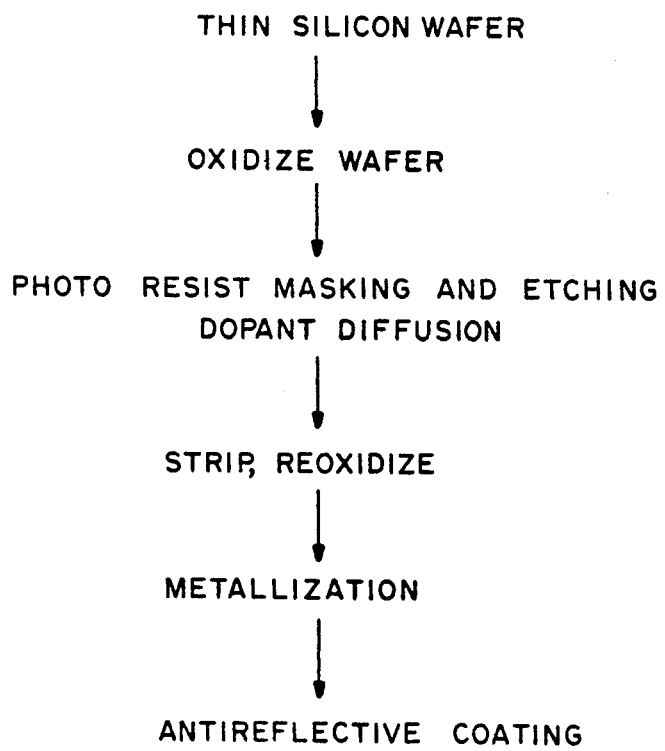
(PRIOR ART)
FIG.—1B

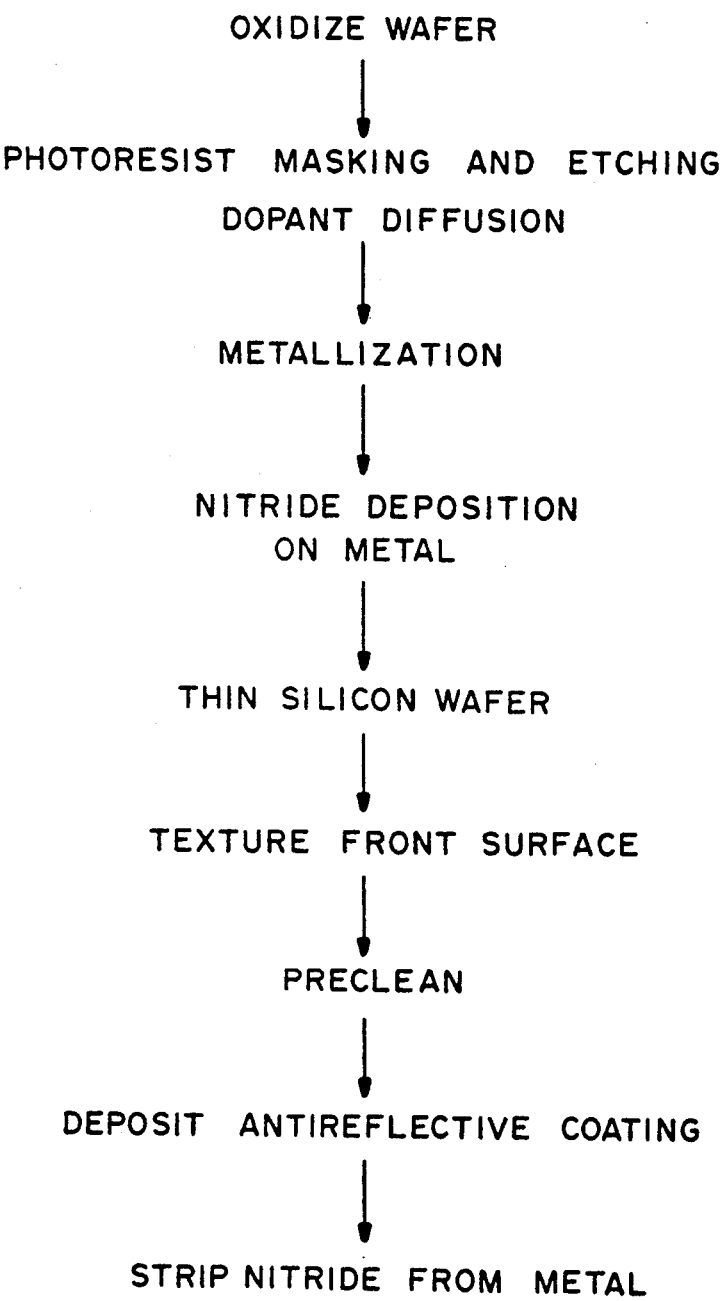
FIG.—2

METHOD OF MAKING PASSIVATED ANTIREFLECTIVE COATING FOR PHOTOVOLTAIC CELL

BACKGROUND OF THE INVENTION

This invention relates generally to photovoltaic cells, and more particularly the invention relates to the fabrication of such cells and the passivating antireflective coatings used thereon.

The back contact solar cell is a well-known device for converting solar energy to electrical energy. See Swanson et al., "Point Contact Silicon Solar Cells," *IEEE Transactions on Electron Devices*, Vol. ED-31, No. 5, May 1984, pages 661–664. The structure includes a lightly-doped or intrinsic silicon substrate in which alternating rows of p-doped regions and n-doped regions are formed in one major (back side) surface. Two metal layers respectively contact the p- and n-doped regions with the two metal layers being separated by an electrically insulating layer. Alternatively, interdigitated metal contacts provide electrical contacts to the doped regions and provide voltage output terminals for the cell in response to the generation of electron-hole pairs in the semiconductor material by impinging photons. The opposite major surface (front side) is covered by a passivation layer to minimize recombination of electrons and holes at the surface and provide high transmission of photons into the bulk material Conventionally, thermally-grown silicon oxide and deposited silicon nitride, or other transparent layers such as magnesium fluoride or zinc sulfide, have been used as passivation material.

A typical and normal method of producing a passivating, antireflection film or layer on photovoltaic or photoelectric material such as silicon utilizes thermal oxidation. The oxidation is usually produced by oxidizing the silicon prior to metallization at temperatures ranging from 850° C. to 1200° C., typically 1000° C., in an oxygen atmosphere. The resulting oxide layer may be one-quarter wavelength of average light or, for example, 114 nanometers thick. Alternatively, a thinner layer of thermal oxide may be used upon which various layers of other antireflective material such as silicon nitride or magnesium fluoride are deposited to further maximize the right transmission.

The semiconductor substrate for the photovoltaic cell must be thin. Conventionally, a semiconductor wafer is initially thinned by etching prior to the fabrication of the doped regions and the metallization. A limiting factor in the thinning of the wafer is the requisite structural strength required of the wafer during the subsequent processing. Accordingly, the thickness of the wafer must be several hundred micrometers to ensure adequate structural strength.

SUMMARY OF THE INVENTION

An object of the present invention is an improved photovoltaic cell.

Another object of the invention is a process for fabricating a photovoltaic cell which results in increased yield of finished product.

Still another object of the invention is a photovoltaic cell having reduced thickness.

Another object of the invention is an improved antireflective coating.

A feature of the invention is the thinning of a semiconductor substrate for the photovoltaic cell following the formation of the diffused regions and metallization.

Another feature of the invention is a passivating antireflective coating formed at temperatures lower than the alloying temperature of the metallization.

Briefly, the present invention permits a thick wafer fabrication process, thereby improving process yield. The thinning of the semiconductor substrate occurs after the dopant diffusion and metallization steps. Accordingly, the final passivation steps do not utilize high-temperature processing.

More particularly, the processing of a thick wafer (e.g. 525 micrometers) in accordance with the invention begins with a thermal oxidation of all surfaces of the semiconductor substrate, followed by photovoltaic masking and etching for the selective diffusion of dopants into the back side of the wafer. Thereafter, the metallization for interconnecting the doped regions is formed by metal deposition and etching. A protective layer of silicon nitride, for example, is then formed over the metal, and the wafer is then thinned by etching the front surface with potassium hydroxide or other suitable etchant. Since the major processing steps have been completed, the substrate can be thinned to approximately 100 micrometers.

Thereafter, the semiconductor substrate not covered by metal is cleaned and a passivation layer is formed thereon. The cleaning can be by applying a hot hydrofluoric acid or a hot sulfuric acid to the semiconductor substrate. Alternatively, in accordance with another feature of the invention, ammonia plasma can be employed as an in situ precursor to a deposited silicon nitride passivation layer. Otherwise, the passivation layer must be formed after the cleaning step by low-temperature silicon oxide deposition or silicon nitride deposition.

The silicon nitride is then stripped from the metal and an additional antireflective coating can be formed on the semiconductor body if desired.

The invention and objects and features thereof will be more readily apparent from the following detailed description and appended claims when taken with the drawing.

BRIEF DESCRIPTION OF THE DRAWING

FIG. 1A is a cross-sectional view of a point contact photovoltaic cell in accordance with the prior art, and FIG. 1B is a flow diagram of process steps in fabricating the point contact photovoltaic cell of FIG. 1A in accordance with the prior art.

FIG. 2 is a flow diagram of process steps in fabricating a point contact photovoltaic cell in accordance with the present invention.

DETAILED DESCRIPTION OF ILLUSTRATIVE EMBODIMENT

Referring now to the drawing, FIG. 1A is a section view of a point contact silicon solar cell such as disclosed by Swanson et al. in "Point Contact Silicon Solar Cells," supra. The device is fabricated in a lightly-doped or intrinsic silicon substrate 10 by the formation of a plurality of alternating p-doped regions 12 and n-type regions 14. The n-doped regions 14 are interconnected by a first metallization layer 16, and the p-doped regions 12 are interconnected by a second metallization layer 18. The first metallization layer is electrically insulated from the silicon substrate except at the doped regions 12 by a silicon oxide layer 20, and the second metallization layer 18 is electrically isolated from the first metallization layer 16 by an oxide layer 22. If the metallization layers 16, 18 are aluminum, the metallization layer 22 can be aluminum oxide. While Swanson et al. describe the optimum thickness of the silicon substrate as being 100 micrometers, in practice the thickness has been limited to several hundred micrometers in order to provide sufficient structural strength for the device during fabrication and an acceptable production yield. The top surface can be textured and then an antireflective layer 24 is formed thereon.

FIG. 1B is a flow diagram illustrating the steps in fabricating the device of FIG. 1A in accordance with conventional manufacturing techniques. Initially, a silicon wafer 10 of approximately 525 micrometers in thickness is reduced in thickness by the application of potassium hydroxide, for example. The prepared wafer is then oxidized at about 1,050° C. in an oxidation furnace. Thereafter, photoresist masking and etching is employed to form dopant windows through the oxide layer on the back surface of the wafer for the selective introduction of dopants forming the diffused regions 12, 14 of FIG. 1A.

Next, the oxide is stripped, and a new oxide is formed by a reoxidation of the silicon substrate at about 1,050° C. in an oxidation furnace. After photoresist masking and etching to open contact windows through the oxide, the metallization 16 and 18 is then sequentially formed on the back surface to selectively interconnect the p-doped regions 12 and n-doped regions 14. Finally, an antireflective coating of silicon oxide or silicon nitride is provided over the surface of the device.

In accordance with the present invention, a fabrication process is provided which reduces the opportunity and occurrence for wafer breakage during the fabrication process yet allows the final structure to have a reduced thickness of approximately 100 micrometers. The delayed wafer thinning in accordance with the process allows forming a thinner final product at higher yields than that available conventionally.

The general process steps are illustrated in FIG. 2. Initially, the thick silicon wafer is oxidized by thermal oxidation and the doped regions in the back surface are formed by photoresist masking and etching and selective dopant diffusion, as in the prior art. Thereafter, the metallization interconnecting the doped regions is formed on the back surface. The metallization can be aluminum with aluminum oxide or a low-temperature silicon oxide formed to electrically isolate the two metal layers.

Thereafter, silicon nitride is deposited on the metal surface to protect the metal from a subsequent thinning process. The front surface of the wafer is then thinned using potassium hydroxide, for example, while the silicon nitride protects the metallization on the back surface. Since the diffusion and metallization steps have been completed, the wafer can be thinned to the order of 100 micrometers or less while still maintaining a high production yield. The front surface is then textured such as taught in copending application Ser. No. 332,286 filed Mar. 31, 1989, now U.S. Pat. NO. 4,918,030 to prevent reflection of photons from the semiconductor body.

Thereafter, the semiconductor surfaces are cleaned using a hot nitric acid or hot sulfuric acid to remove all foreign material and passivate the textured silicon surface and then rinsing the cleaned surface in deionized water. Precleaning with hot nitric acid requires the substeps of:

HF acid, typically diluted in pure water 20:1, H2O, one minute;
HNO3 at 110°-130° C., typically 1-2 minutes;
Pure, deionized water rinse, typically 5 minutes;
Dry, typically 5 minutes in clean nitrogen.

Next, the cleaned silicon substrate is placed in a deposition furnace or low pressure chemical deposition reactor for the deposition of an antireflective material such as silicon oxide or silicon nitride. The deposition of the antireflective material is accomplished at a low temperature (350°-380° C.) which is well below the alloying or reactive temperature of the metallized silicon back surface.

Finally, the silicon nitride is stripped from the metal surface using conventional techniques such as a plasma silicon fluoride. Additional antireflecting coating can be deposited on the surface of the device if desired.

In accordance with a feature of the invention, the steps of precleaning the silicon surfaces and depositing an antireflecting layer can be combined by using ammonia (NH3) as an in situ precursor to the deposition of an antireflective layer such as silicon nitride. In this embodiment, the wafers are loaded on a precleaned platen at b 350° C. and the atmosphere is then pumped down to about 200 torr. The pretreatment with NH3:N2 uses a volume flow rate ratio of about 0.74:1 for about one minute. Thereafter, silicon nitride is deposited on the cleaned surface using a SiH4:NH3:N2 volume flow rate ratio of about 0.14:0.74:1 for three minutess. The gas ratios, times, temperatures and power levels will depend on the equipment used and the thickness of the antireflective material.

The photovoltaic cells fabricated in accordance with the present invention have improved operating characteristics due to the thinner silicon substrates without affecting production process yields.

While the invention has been described with reference to a specific structure and specific process embodiments, the descriptions are illustrative of the invention and are not to be construed as limiting the invention. For example the invention has applicability in fabricating back contact photovoltaic cells utilizing interdigitated metal contacts rather than point contacts. Antireflective material other than silicon oxide and silicon nitride can be employed in the process. Thus, various modifications and applications may occur to those skilled in the art without departing from the true spirit and scope of the invention as defined by the appended claims.

We claim:

1. A method of fabricating a point contact photovoltaic cell comprising the steps of
   (a) providing a semicondcutor substrate,
   (b) oxidizing the surfaces of said semiconductor substrate,
   (c) forming a plurality of doped regions of p-conductivity type and n-conductivity type in a first major surface of said substrate;
   (d) forming first and second metallization layers for interconnecting said plurality of doped regions,
   (e) depositing silicon nitride on said first and second metallization layers as an etchant protection layer,
   (f) thinning said substrate by etching a second major surface opposite from said first major surface, and
   (g) forming a layer of antireflective material on said second major surface.

2. The method as defined by claim wherein step (g) includes precleaning said second major surface prior to forming said layer of antireflective material.

3. The method as defined by claim 2 wherein said precleaning includes applying hot nitric acid to said second major surface.

4. The method as defined by claim 2 wherein said precleaning includes applying hot sulfuric acid to said second major surface.

5. The method as defined by claim 2 wherein said precleaning includes ammonia plasma etching said second major surface.

6. The method as defined by claim 5 wherein said precleaning by ammonia plasma is performed in situ as a precursor to step (g), and step (g) includes depositing silicon nitride on said second major surface.

7. The method as defined by claim 2 wherein step (g) includes depositing silicon oxide on said second major surface.

8. The method as defined by claim 7 wherein step (g) further includes depositing silicon nitride on said silicon oxide.

9. The method as defined by claim 2 wherein step (g) includes depositing silicon nitride on said second major surface.

* * * * *